(12) United States Patent
Hong et al.

(10) Patent No.: US 9,748,515 B2
(45) Date of Patent: Aug. 29, 2017

(54) ORGANIC LIGHT-EMITTING DIODE DISPLAY AND METHOD OF MANUFACTURING THE SAME INCLUDING A SEALANT WITH A PLURALITY OF OPENINGS AND ISLANDS FORMED WITHIN THE OPENINGS

(71) Applicant: Samsung Display Co., Ltd., Yongin, Gyeonggi-Do (KR)

(72) Inventors: Sangmin Hong, Yongin (KR); Jungi Youn, Yongin (KR); Goeun Lee, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/796,159

(22) Filed: Jul. 10, 2015

(65) Prior Publication Data

US 2016/0218317 A1 Jul. 28, 2016

(30) Foreign Application Priority Data

Jan. 22, 2015 (KR) ........................ 10-2015-0010547

(51) Int. Cl.
  *H01L 27/32* (2006.01)
  *H01L 51/52* (2006.01)
(52) U.S. Cl.
  CPC ...... *H01L 51/5246* (2013.01); *H01L 27/3258* (2013.01)
(58) Field of Classification Search
  None
  See application file for complete search history.

(56) References Cited

U.S. PATENT DOCUMENTS

| 2004/0150319 A1* | 8/2004 | Tomimatsu ......... H01L 27/3246 |
| | | 313/495 |
| 2005/0030264 A1* | 2/2005 | Tsuge ..................... G09G 3/325 |
| | | 345/76 |
| 2007/0171637 A1 | 7/2007 | Choi |
| 2010/0102719 A1 | 4/2010 | Lee et al. |
| 2012/0319574 A1 | 12/2012 | Kim et al. |

FOREIGN PATENT DOCUMENTS

| KR | 10-2001-0084380 A | 9/2001 |
| KR | 10-2005-0019273 A | 3/2005 |
| KR | 10-2005-0024031 A | 3/2005 |
| KR | 10-2006-0072745 A | 6/2006 |
| KR | 10-2007-0083009 A | 8/2007 |
| KR | 10-2010-0047585 A | 5/2010 |
| KR | 10-2012-0139075 A | 12/2012 |

* cited by examiner

*Primary Examiner* — Jay C Chang
(74) *Attorney, Agent, or Firm* — Knobbe Martens Olson & Bear LLP

(57) ABSTRACT

An organic light-emitting diode (OLED) display is disclosed. In one aspect, the OLED display includes a first substrate and a second substrate facing each other, a display unit formed between the first and second substrates and a sealant formed between the first and second substrates and bonding the first and second substrates. The sealant includes a sealing portion surrounding and sealing the display unit, the sealing portion having a plurality of first openings separate from each other along a circumferential direction of the display unit. The sealant also includes an adhesion reinforcing portion including a plurality of islands that are respectively formed inside the first openings and separate from the sealing portion.

16 Claims, 10 Drawing Sheets

ORGANIC LIGHT-EMITTING DIODE DISPLAY AND METHOD OF MANUFACTURING THE SAME INCLUDING A SEALANT WITH A PLURALITY OF OPENINGS AND ISLANDS FORMED WITHIN THE OPENINGS

INCORPORATION BY REFERENCE TO ANY PRIORITY APPLICATIONS

This application claims the benefit of Korean Patent Application No. 10-2015-0010547, filed on Jan. 22, 2015, in the Korean Intellectual Property Office, the disclosure of which is incorporated herein in its entirety by reference.

BACKGROUND

Field

The described technology generally relates to an organic light-emitting display apparatus and a method of manufacturing the same.

Description of the Related Technology

Generally, a display device, such as an organic light-emitting diode (OLED) display including a thin-film transistor (TFT), is receiving attention since the display device is used in many commercial applications such as a mobile device, a smartphone, a tablet computer, an ultra-slim laptop, a digital camera, a video camera, a portable information terminal, and an ultra-thin television.

An OLED display includes an upper substrate and a lower substrate sealed in order to protect the matrix of OLED pixels from the environment. In this regard, a sealant is coated between the upper and lower substrates and then hardened so as to bond the two substrates. Since organic materials degrade in air and moisture, the life and reliability of the display device can be determined based on the degree of bonding of the substrates by the sealant.

SUMMARY OF CERTAIN INVENTIVE ASPECTS

One inventive aspect relates to an OLED display and a method of manufacturing the same, in which bond strength of a sealant is entirely increased and reliability of a product is increased without having to increase a sealing width, by increasing bond strength at a partial region of the sealant.

Another aspect is an OLED display that includes: a first substrate and a second substrate, which are formed to face each other; a display unit that is formed between the first and second substrates; and a sealant that is formed between the first and second substrates and bonds the first and second substrates, wherein the sealant includes: a sealing portion that surrounds the display unit to seal the display unit, the sealing portion including a plurality of openings that are separate from each other along a circumferential direction of the display unit; and an adhesion reinforcing portion that includes a plurality of islands that are respectively formed inside the plurality of openings and separate from the sealing portion.

A size of each of the plurality of islands may be smaller than a size of each of the plurality of openings.

The adhesion reinforcing portion may be formed at a center in a width direction of the sealing portion.

A height of the adhesion reinforcing portion may be lower than a height of the sealing portion.

The plurality of islands may be separate from each other along a length direction of the sealant.

A shape of each of the plurality of islands may be any one of a circle, an oval, and a polygon.

A shape of each of the plurality of openings may be any one of a circle, an oval, and a polygon.

A distance between the sealing portion and each of the plurality of islands may be less than or equal to about 5 µm.

A width of the sealant may be less than or equal to about 1.2 mm.

The sealing portion may further includes a plurality of second openings that are separate from the plurality of openings in a width direction, and the adhesion reinforcing portion may further include a plurality of second islands that are respectively formed inside the plurality of second openings and separate from the sealing portion.

The sealant may further include an expanded sealing portion that is formed in at least one of an inner side or an outer side of the sealing portion.

Another aspect is a method of manufacturing an OLED display, the method including: forming a sealant on a first substrate or a second substrate; arranging the first and second substrates to face each other such that the sealant contacts the first and second substrates; and adhering the first and second substrates together by irradiating a laser beam onto the sealant, wherein the sealant includes: a sealing portion that surrounds a display unit formed on the first substrate and includes a plurality of openings that are separate from each other along a circumferential direction of the display unit; and an adhesion reinforcing portion that comprises a plurality of islands that are respectively formed inside the plurality of openings and separate from the sealing portion.

The laser beam may be focused on the adhesion reinforcing portion.

These general and specific embodiments may be implemented by using a system, a method, a computer program, or a combination of the system, the method, and the computer program.

Another aspect is an organic light-emitting diode (OLED) display comprising: a first substrate and a second substrate facing each other; a display unit formed between the first and second substrates; and a sealant formed between the first and second substrates and bonding the first and second substrates, wherein the sealant comprises: a sealing portion surrounding and sealing the display unit, the sealing portion having a plurality of first openings separate from each other along a circumferential direction of the display unit; and an adhesion reinforcing portion including a plurality of islands that are respectively formed inside the first openings and separate from the sealing portion.

In the above OLED display, the size of each of the islands is smaller than the size of the corresponding first opening. In the above OLED display, the adhesion reinforcing portion is formed at the center, in a width direction, of the sealing portion. In the above OLED display, the height of the adhesion reinforcing portion is less than the height of the sealing portion. In the above OLED display, the islands are separate from each other along a length direction of the sealant. In the above OLED display, each of the islands has one of the following shapes: a circle, an oval, and a polygon. In the above OLED display, each of the first openings has one of the following shapes: a circle, an oval, and a polygon. In the above OLED display, the distance between the sealing portion and each of the islands is less than or equal to about 5 µm. In the above OLED display, the width of the sealant is less than or equal to about 1.2 mm.

In the above OLED display, the sealing portion has a plurality of second openings that are separate from the first openings in a width direction, and wherein the adhesion reinforcing portion further comprises a plurality of second islands that are respectively formed inside the second openings and separate from the sealing portion. In the above OLED display, the sealant further comprises an expanded sealing portion formed in at least one of an inner side or an outer side of the sealing portion. In the above OLED display, the islands are substantially evenly spaced apart.

The above OLED display further comprises: a first gate insulating film formed over the first substrate; a metal layer having a plurality of first through holes and formed on the first gate insulating film; a second gate insulating film covering the metal layer; and an interlayer insulating film formed on the second gate insulating film, wherein a plurality of second through holes are formed in the second gate insulating film and the interlayer insulating film, and wherein the adhesion reinforcing portion connected to the first gate insulating film via the first and second through holes. In the above OLED display, each of the first through holes is larger than each of the second through holes.

Another aspect is a method of manufacturing an organic light-emitting diode (OLED) display, the method comprising: forming a sealant on at least one of first and second substrates; arranging the first and second substrates to face each other such that the sealant contacts the first and second substrates; and irradiating a laser beam onto the sealant such that the first and second substrates are adhered to each other via the sealant, wherein the sealant comprises: a sealing portion that surrounds a display unit formed on the first substrate, wherein the sealing portion has a plurality of first openings that are separate from each other along a circumferential direction of the display unit; and an adhesion reinforcing portion comprising a plurality of islands that are respectively formed inside the first openings and separate from the sealing portion.

In the above method, the laser beam is focused on the adhesion reinforcing portion. In the above method, the size of each of the islands is smaller than the size of the corresponding first opening. In the above method, the height of the adhesion reinforcing portion is less than the height of the sealing portion. In the above method, each of the islands has one of the following shapes: a circle, an oval, and a polygon. In the above method, the islands are substantially evenly spaced apart.

BRIEF DESCRIPTION OF THE DRAWINGS

These and/or other aspects will become apparent and more readily appreciated from the following description of the exemplary embodiments, taken in conjunction with the accompanying drawings.

DETAILED DESCRIPTION OF CERTAIN INVENTIVE EMBODIMENTS

Figure 1:
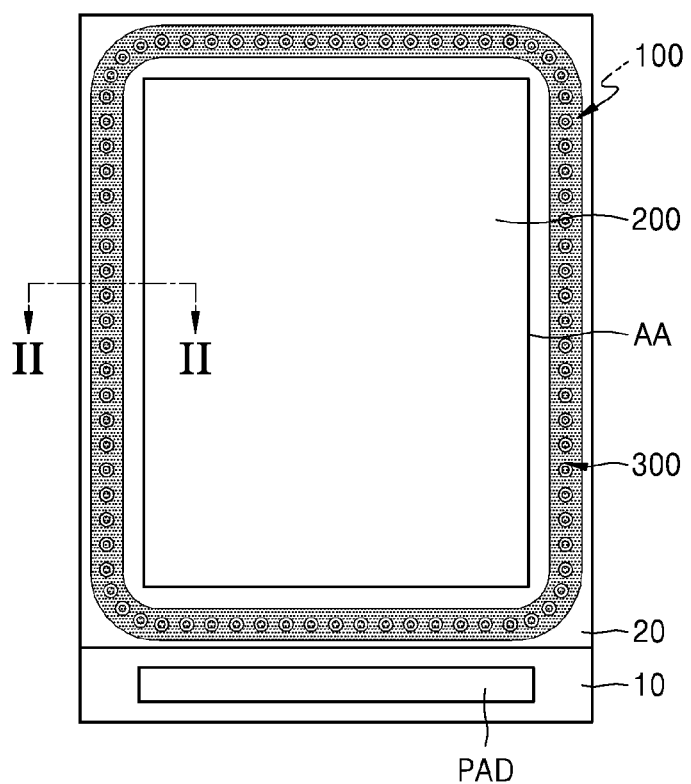
FIG. 1 is a schematic plan view of an OLED display according to an exemplary embodiment.

Reference will now be made in detail to embodiments, examples of which are illustrated in the accompanying drawings. In this regard, the present embodiments may have different forms and should not be construed as being limited to the descriptions set forth herein. Accordingly, the embodiments are merely described below, by referring to the figures, to explain aspects of the present description.

In drawings, like reference numerals refer to like elements throughout and overlapping descriptions shall not be repeated.

As used herein, the term "and/or" includes any and all combinations of one or more of the associated listed items. Expressions such as "at least one of", when preceding a list of elements, modify the entire list of elements and do not modify the individual elements of the list.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be understood that when a layer, region, or component is referred to as being "formed on," another layer, region, or component, it can be directly or indirectly formed on the other layer, region, or component. That is, for example, intervening layers, regions, or components may be present. In this disclosure, the term "substantially" includes the meanings of completely, almost completely or to any significant degree under some applications and in accordance with those skilled in the art. The term "connected" includes an electrical connection.

Figure 2:
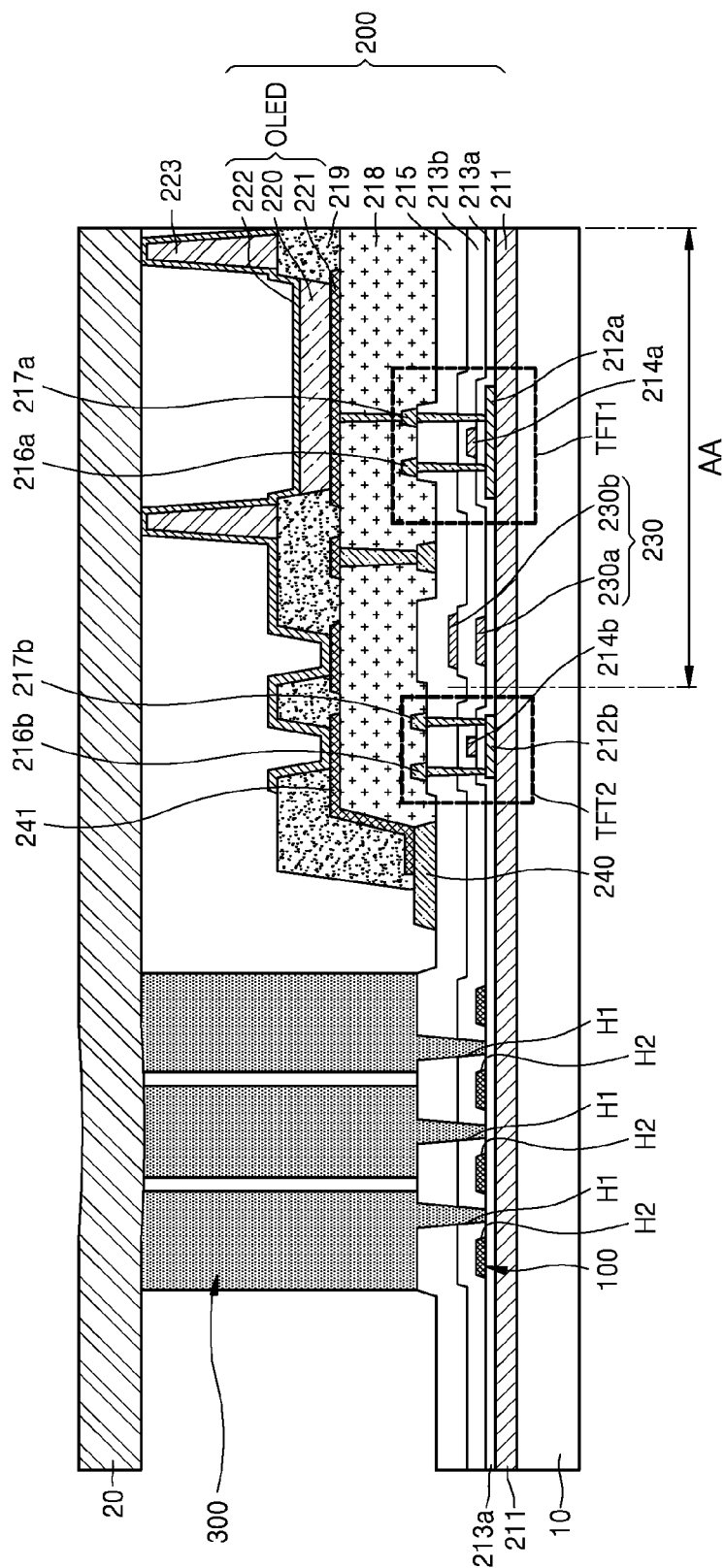
FIG. 2 is a cross-sectional view taken along a line II-II of FIG. 1.

FIG. 1 is a schematic plan view of an OLED display 1 according to an exemplary embodiment, and FIG. 2 is a cross-sectional view taken along a line II-II of FIG. 1.

Referring to FIGS. 1 and 2, the OLED display 1 includes a first substrate 10, a second substrate 20 that faces the first substrate 10, and a sealant 300 that is formed between the first and second substrates 10 and 20 to bond the first and second substrates 10 and 20.

The first substrate 10 may be a glass substrate, a polymer substrate, a metal substrate, or a complex substrate thereof. Alternatively, the first substrate 10 may be a flexible substrate, and may be formed of plastic having excellent thermal resistance and durability.

The second substrate 20 may be formed of a transparent material. Accordingly, an image realized on a display unit 200 may be externally exposed through the second substrate 20. According to some exemplary embodiments, the second substrate 20 includes an on-cell touch screen panel on which a touch screen pattern is formed such that the second substrate 20 may operate as a touch panel.

A polarization film, a color filter, or a protection window (not shown) may be formed on the second substrate 20.

The display unit 200 is provided on the first substrate 10. The display unit 200 defines a display area AA on the first substrate 10, and may include an OLED. Meanwhile, a pad unit PAD is formed around the display area AA so as to transmit an electronic signal from a power supply device (not shown) or a signal generating apparatus (not shown) to the display area AA.

The display unit 200 and a structure for sealing the display unit 200 will now be described in detail with reference to FIG. 2.

A buffer layer 211 may be formed directly on the first substrate 10. The buffer layer 211 may be formed on the entire surface of the first substrate 10, i.e., on the display area AA and a region (or a non-display area) surrounding the display area AA. The buffer layer 211 provides a flat surface on the first substrate 10 and prevents impure elements from penetrating through the first substrate 10, and may be formed of any one of various materials for performing such functions.

Insulating layers may be formed on the second substrate 20. The insulating layers may include first and second gate insulating films 213a and 213b, and an interlayer insulating film 215.

First and second thin-film transistors TFT1 and TFT2 may be formed on the buffer layer 211. The first thin-film transistor TFT1 includes a first active layer 212a, a first gate electrode 214a, a first source electrode 216a, and a first drain electrode 217a. The first gate insulating film 213a is formed between the first gate electrode 214a and the first active layer 212a to insulate them from each other. The first gate electrode 214a is formed to overlap a part of the first active layer 212a on the first gate insulating film 213a. The first thin-film transistor TFT1 is formed below the organic light-emitting diode OLED, and may be a driving thin-film transistor for driving the organic light-emitting diode OLED.

The second thin-film transistor TFT2 includes a second active layer 212b, a second gate electrode 214b, a second source electrode 216b, and a second drain electrode 217b. The first gate insulating film 213a is formed between the second gate electrode 214b and the second active layer 212b to insulate them from each other. The second gate electrode 214b is formed to overlap a part of the second active layer 212b on the first gate insulating film 213a.

The first active layer 212a and the second active layer 212b may be prepared on the buffer layer 211. The first active layer 212a and the second active layer 212b may be formed of an inorganic semiconductor, such as amorphous silicon or polysilicon, or an organic semiconductor. According to some embodiments, the first active layer 212a may be formed of an oxide semiconductor. The oxide semiconductor may contain an oxide of a material selected from among 12, 13, and 14-group metal elements, such as zinc (Zn), indium (In), gallium (Ga), tin (Sn), cadmium (Cd), germanium (Ge), and hafnium (Hf), and a combination thereof.

The first gate insulating film 213a may be provided on the buffer layer 211 to cover the first active layer 212a and the second active layer 212b. The second gate insulating film 213b is formed to cover the first gate electrode 214a and the second gate electrode 214b.

Each of the first and second gate electrodes 214a and 214b may include a single or multi-layer film of gold (Au), silver (Ag), copper (Cu), nickel (Ni), platinum (Pt), palladium (Pd), aluminum (Al), molybdenum (Mo), or chromium (Cr), or may include an alloy, such as Al:Nd or Mo:W.

Each of the first and second gate insulating films 213a and 213b may include an inorganic film formed of silicon oxide, silicon nitride, or metal oxide, and may be formed of a single layer or a plurality of layers of the inorganic film.

The interlayer insulating film 215 is formed on the second gate insulating film 213b. The interlayer insulating film 215 may be an inorganic film formed of silicon oxide or silicon nitride. The interlayer insulating film 215 may include an organic film.

The first source electrode 216a and the first drain electrode 217a are formed on the interlayer insulating film 215. Each of the first source electrode 216a and the first drain electrode 217a contacts the first active layer 212 through a contact hole. Also, the second source electrode 216b and the second drain electrode 217b are formed on the interlayer insulating film 215, and each of the second source electrode 216b and the second drain electrode 217b contacts the second active layer 212b through a contact hole. The first source electrode 216a, the second source electrode 216b, the first drain electrode 217a, and the second drain electrode 217b may be formed of a metal, an alloy, metal nitride, conductive metal oxide, or a transparent conductive material.

A capacitor 230 may be formed in the display area AA. The capacitor 230 may store a data signal supplied to the display unit 200, or compensate for a voltage drop of the display unit 200.

The capacitor 230 may include a first capacitor electrode 230a, a second capacitor electrode 230b, and the second gate insulating film 213b formed therebetween. The first capacitor electrode 230a may be formed of the same material as the second gate electrode 214b, and the second capacitor electrode 230b may be formed of the same material as the first gate electrode 214a.

A planarization film 218 covers the first and second thin-film transistors TFT1 and TFT2 and the capacitor 230, and is formed on the interlayer insulating film 215. The planarization film 218 may remove a stepped portion of films and flatten the films in order to increase a light-emitting efficiency of the OLED to be formed on the planarization film 218. Also, the planarization film 218 may include a through hole for exposing a part of the first drain electrode 217a.

The planarization film 218 may be formed of an insulating material. For example, the planarization film 218 may have a structure of a single layer or a plurality of layers formed of an inorganic material, an organic material, or an organic/inorganic composite, and may be formed via any one of various deposition methods. According to some exemplary embodiments, the planarization film 218 is formed of at least one material from among polyacrylate resin, epoxy resin, phenolic resin, polyamides resin, polyimide resin, unsaturated polyesters resin, polyphenylene ether resin, polyphenylene sulfide resin, and benzocyclobutene (BCB).

However, the described technology is not limited to the above structure, and any one of the planarization film 218 and the interlayer insulating film 215 may be omitted.

The OLED is formed on the planarization film 218, and includes a first electrode 221, an intermediate layer 220 including an organic emission layer, and a second electrode 222. A pixel-defining film 219 is formed to cover parts of the planarization film 218 and the first electrode 221, and defines a pixel area PA and a non-pixel area NPA.

Holes and electrons injected from the first and second electrodes 221 and 222 of the OLED may combine in the organic emission layer of the intermediate layer 220, thereby generating a light.

The intermediate layer 220 may include the organic emission layer. Alternatively, the intermediate layer 220 may include the organic emission layer, and further include at least one of a hole injection layer (HIL), a hole transport layer (HTL), an electron transport layer (ETL), and an electron injection layer (EIL). However, the current embodiment is not limited thereto, and the intermediate layer 220 may include the organic emission layer and further include other various functional layers.

The second electrode 222 is formed on the intermediate layer 220. The second electrode 222 may form an electric field with the first electrode 221 such that a light is emitted from the intermediate layer 220. The first electrode 221 may be patterned per pixel, and the second electrode 222 may be formed to apply a common voltage to all pixels. The second electrode 222 may be electrically connected to a power supply wire 240 formed at an edge of the display area AA through a connection wire 241.

Each of the first and second electrodes 221 and 222 may be a transparent electrode or a reflective electrode. The first electrode 221 may operate as an anode and the second electrode 222 may operate as a cathode, but alternatively, the first electrode 221 may operate as a cathode and the second electrode 222 may operate as an anode.

In FIG. 2, only one OLED is illustrated, but a plurality of OLEDs may be formed in the display area AA. A pixel may be formed per OLED, and red, green, blue, or white may be realized per pixel.

A protection layer (not shown) may be formed on the second electrode 222, and may cover and protect the organic light-emitting diode OLED. The protection layer may include an inorganic insulating film and/or an organic insulating film.

A spacer 223 may be formed between the first and second substrates 10 and 20 to maintain an interval between the first and second substrates 10 and 20. The spacer 223 may be provided such that a display characteristic is not deteriorated due to an external impact.

According to some exemplary embodiments, the spacer 223 is provided on the pixel-defining film 219. The spacer 223 may protrude from the pixel-defining film 219 towards the second substrate 20. According to some exemplary embodiments, the pixel-defining film 219 and the spacer 223 are integrally formed via a photolithography process or a photo-etching process using a photosensitive material. In other words, the pixel-defining film 219 and the spacer 223 may be simultaneously or concurrently formed by using a half-tone mask while adjusting an exposure amount through an exposure process.

The second electrode 222 and/or the protection layer may be formed on the spacer 223.

A circuit pattern is formed outside the display area AA, wherein the circuit pattern includes the power supply wire 240 and the connection wire 241 that electrically connects the power supply wire 240 and the display unit 200.

The power supply wire 240 may be formed on the interlayer insulating film 215. The power supply wire 240 may be formed outside the display area AA. The power supply wire 240 may supply a signal to the second electrode 222 by being electrically connected to the second electrode 222 via the connection wire 241.

The power supply wire 240 may be a cathode power supply line ELVSS. When the power supply wire 240 is the cathode power supply line EVLSS, the cathode power supply line ELVSS may be connected to a cathode power source having a voltage lower than a common power supply voltage, for example, having a ground voltage or a negative voltage.

The sealant 300 is formed between the first and second substrate 10 and 20 to surround the display unit 200.

In order to reduce a dead space of the OLED display 1, the width of the sealant 300 may be less than or equal to about 1.2 mm. However, the width of the sealant 300 may be equal to or greater than about 60 μm such that the first and second substrates 10 and 20 are stably bonded to each other.

The sealant 300 may be formed on the insulating layers.

The sealant 300 may include an inorganic material. For example, the sealant 300 may include glass frit. The glass frit generally means a glass raw material in a power form, but an exemplary embodiment is not limited thereto, and the glass frit may be in a paste state in which a laser or infrared ray absorber, an organic binder, and a filter for reducing a thermal expansion coefficient are added to a main material, such as SiO2.

Figure 3:
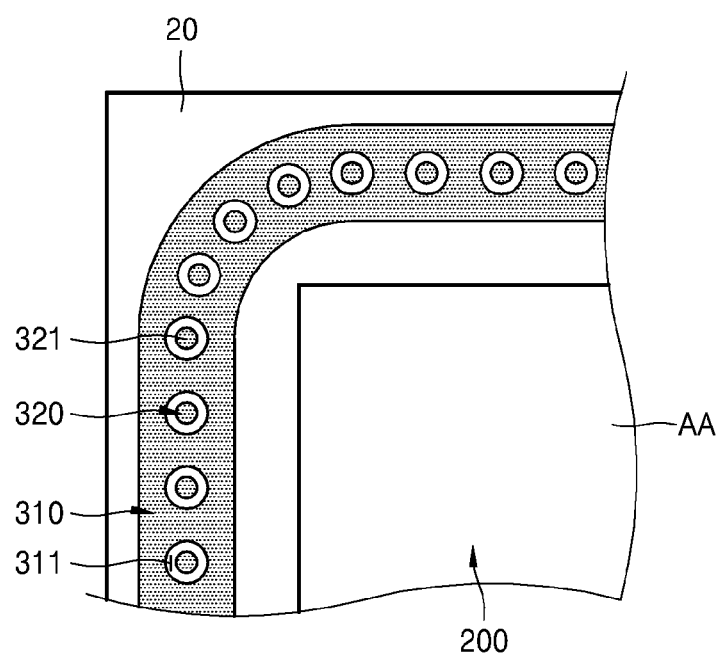
FIG. 3 is an enlarged plan view of a part of the OLED display of FIG. 1.
Figure 4:
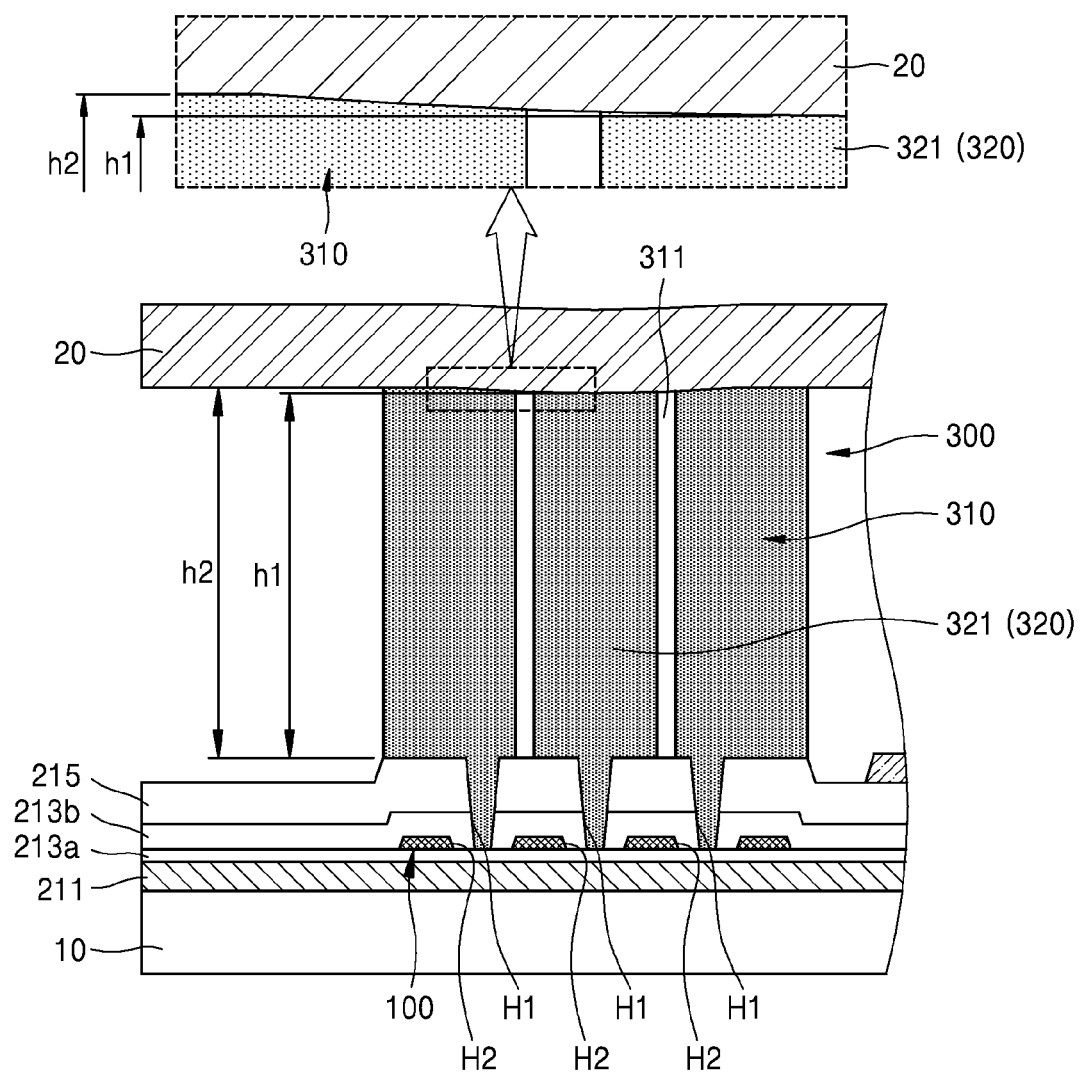
FIG. 4 is an enlarged cross-sectional view of a part of FIG. 2.

FIG. 3 is an enlarged plan view of a part of the OLED display 1 of FIG. 1, and FIG. 4 is an enlarged cross-sectional view of a part of FIG. 2. Referring to FIGS. 3 and 4, the sealant 300 includes a sealing portion 310 and an adhesion reinforcing portion 320.

The sealing portion 310 and the adhesion reinforcing portion 320 may include an inorganic material. For example, each of the sealing portion 310 and the adhesion reinforcing portion 320 includes glass frit. The sealing portion 310 and the adhesion reinforcing portion 320 may be formed of the same material. The sealing portion 310 and the adhesion reinforcing portion 320 may be simultaneously or concurrently formed, or alternatively, may be individually formed.

The sealing portion 310 surrounds the display unit 200, and seals the display unit 200. The sealing portion 310 may have a closed loop shape in general.

A plurality of openings 311 are formed inside the sealing portion 310. The openings 311 may be separate from each other along a length direction of the sealant 300. The openings 311 may be formed at the center in a width direction of the sealant 300. Here, the length direction of the sealant 300 is substantially perpendicular to the width direction of the sealant 300, and may also be referred to as an extending direction of the sealant 300.

Figure 5A:
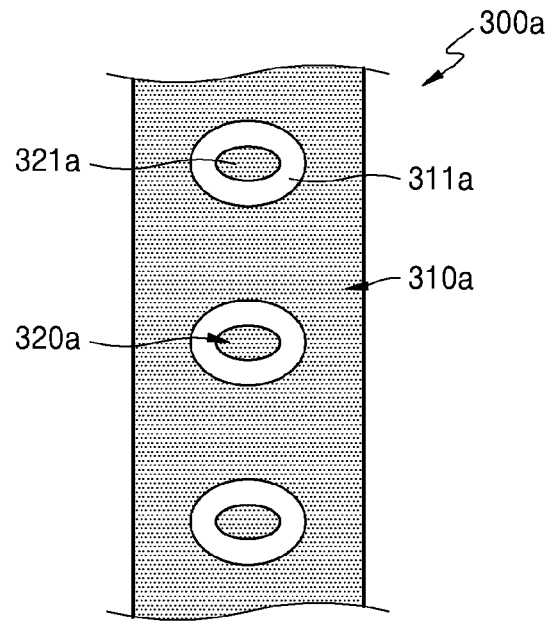
FIGS. 5A through 5C are plan views showing modified examples of sealants.
Figure 5B:
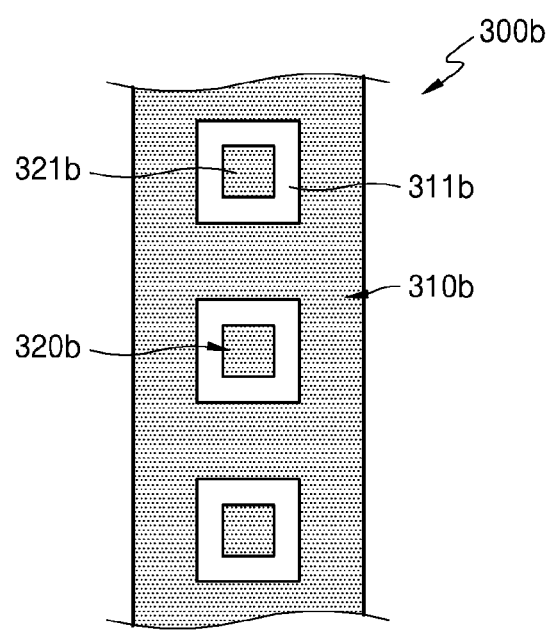
Figure 5C:
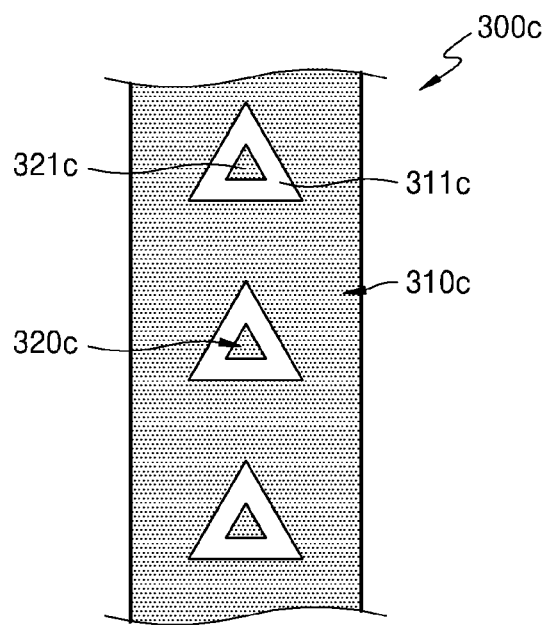

A shape of the opening 311 may be a circle. However, the shape of the opening 311 is not limited thereto, and may vary. For example, as shown in FIG. 5A, a shape of an opening 311a may be an oval, or as shown in FIGS. 5B and 5C, shapes of openings 311b and 311c may be polygons.

The adhesion reinforcing portion 320 may have a dot pattern. The adhesion reinforcing portion 320 includes a plurality of islands 321 respectively formed in the plurality of openings 311. The islands 321 may be separate from each other along the length direction of the sealant 300. The adhesion reinforcing portion 320 may be formed at the center in the width direction of the sealant 300.

A shape of the island 321 may be a circle. However, the shape of the island 321 is not limited thereto, and may vary. For example, as shown in FIG. 5A, a shape of an island 321a may be an oval, or as shown in FIGS. 5B and 5C, shapes of islands 321b and 321c may be polygons.

The shape of the island 321 may correspond to the shape of the opening 311. Alternatively, although not shown, the shape of the island 321 may not correspond to the shape of the opening 311. In other words, the island 321 may have a different size and a different shape from the opening 311.

The size of the island 321 is smaller than the size of the opening 311. For example, when the shapes of the island 321 and the opening 311 are circles, the diameter of the island 321 may be less than the diameter of the opening 311. When the diameter of the island 321 is from about 50 μm to about 100 μm, the diameter of the opening 311 may be from about 60 μm to about 110 μm.

The island 321 formed inside the opening 311 is separate from the sealing portion 310. For example, the distance between the sealing portion 310 and the island 321 may be about 5 μm.

Bond strength of the adhesion reinforcing portion 320 including the islands 321 may be larger than bond strength of the sealing portion 310. Bonding strength of the adhesion reinforcing portion 320 per unit area with respect to the first and second substrates 10 and 20 may be higher than bonding strength of the sealing portion 310 per unit area with respect to the first and second substrates 10 and 20. Accordingly, bonding strength of the sealant 300 with respect to the first and second substrates 10 and 20 may be increased. The bonding strength of the sealant 300 will be described in detail later with reference to a method of manufacturing the OLED display 1.

The height h1 of the adhesion reinforcing portion 320 may be lower than the height h2 of the sealing portion 310.

The height h1 of the adhesion reinforcing portion 320 may be an average height of the islands 321. The height h1 of the adhesion reinforcing portion 320 may be lower than the height h2 of the sealing portion 310 by about 0.2 μm to about 0.4 μm. For example, when the height h2 of the sealing portion 31 is from about 4.5 μm to about 5 μm, the height h1 of the adhesion reinforcing portion 320 may be from about 4.1 μm to about 4.8 μm.

In the above exemplary embodiment, the adhesion reinforcing portion 320 includes one row of the islands 321. However, alternatively, the adhesion reinforcing portion 320 may include at least two rows of the islands 321.

Figure 6:
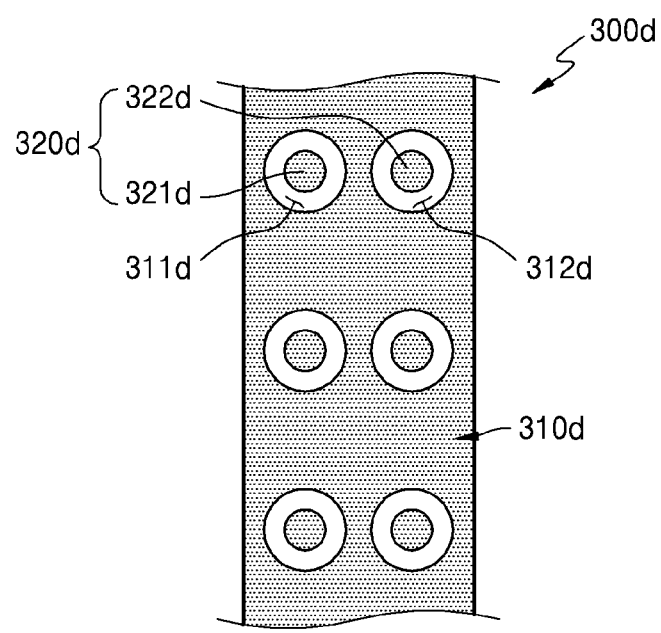
FIG. 6 is a plan view showing another modified example of a sealant.

FIG. 6 is a plan view showing another modified example of a sealant 300d, wherein an adhesion reinforcing portion 320d includes two rows of first and second islands 321d and 322d. Referring to FIG. 6, the sealant 300d includes a sealing portion 310d and the adhesion reinforcing portion 320d.

The sealing portion 310d includes a plurality of first openings 311d that are separate from each other along a length direction of the sealant 300d, and a plurality of second openings 312d that are respectively separate from the first openings 311d and each other along the length direction of the sealant 300d.

The adhesion reinforcing portion 320d may have a dot pattern. The adhesion reinforcing portion 320d may include a plurality of the first islands 321d and a plurality of the second islands 322d. The first islands 321d are respectively formed inside the first openings 311d and separate from the sealing portion 310d. The second islands 322d are respectively formed inside the second openings 312d and separate from the sealing portion 310d.

The first islands 321d are separate from each other in the length direction of the sealant 300d, and the second islands 322d are separate from each other in the length direction of the sealant 300d.

The first and second islands 321d and 322d are separate from each other in a width direction of the sealant 300d. The first and second islands 321d and 322d may be substantially symmetrical based on the center in the width direction of the sealant 300d.

The size of the first island 321d may be smaller than the size of the first opening 311d, and the size of the second island 322d may be smaller than the size of the second opening 312d.

Shapes of the first and second islands 321d and 322d may be circles. However, the shapes of the first and second islands 321d and 322d are not limited thereto, and may vary. For example, the shapes of the first and second islands 321d and 322d may be ovals or polygons.

The shapes of the first and second islands 321d and 322d may respectively correspond to the first and second openings 311d and 312d. Alternatively, although not shown, the shapes of the first and second islands 321d and 322d may not respectively correspond to the shapes of the first and second openings 311d and 312d. In other words, the first and second islands 321d and 322d may have different sizes and different shapes from the first and second openings 311d and 312d.

Bonding strength of the adhesion reinforcing portion 320d may be greater than bonding strength of the sealing portion 310d. Here, the bonding strength may denote bonding strength per unit area. The height of the adhesion reinforcing portion 320d may be lower than the height of the sealing portion 310d.

Referring back to FIG. 4, a metal layer 100 may be formed below the sealant 300. The metal layer 100 may be formed between the first substrate 10 and the sealant 300. For example, the metal layer 100 may be formed on the buffer layer 211.

The metal layer 100 may contain a metal having excellent thermal conductivity. For example, the metal layer 100 may contain at least one of Au, Au, Cu, Ni, Pt, Pd, Al, Mo, and Cr. The metal layer 100 may be formed of the same material and during the same process as the first and second gate electrodes 214a and 214b. Thermal conductivity of the metal layer 100 may be higher than thermal conductivity of the sealant 300.

A plurality of holes H1 (or second through holes) may be formed at the second gate insulating film 213b and the interlayer insulating film 215. A contact area with the sealant 300 is increased through the hole H1, thereby increasing bond strength. A plurality of holes (or first through holes) H2 may be formed at the metal layer 100 at locations respectively corresponding to the plurality of holes H1. The size of the hole H2 is larger than the size of the hole H1. However, a forming structure of the hole H1 is not limited thereto, and the hole H1 may penetrate through at least one of the second gate insulating film 213b and the interlayer insulating film 215. Moreover, the holes H1 and H2 are selective structures, and thus may not be formed as occasion demands.

Meanwhile, in order to increase the bonding strength of the sealant 300, the sealant 300 may further include an expanded sealing portion.

Figure 7:
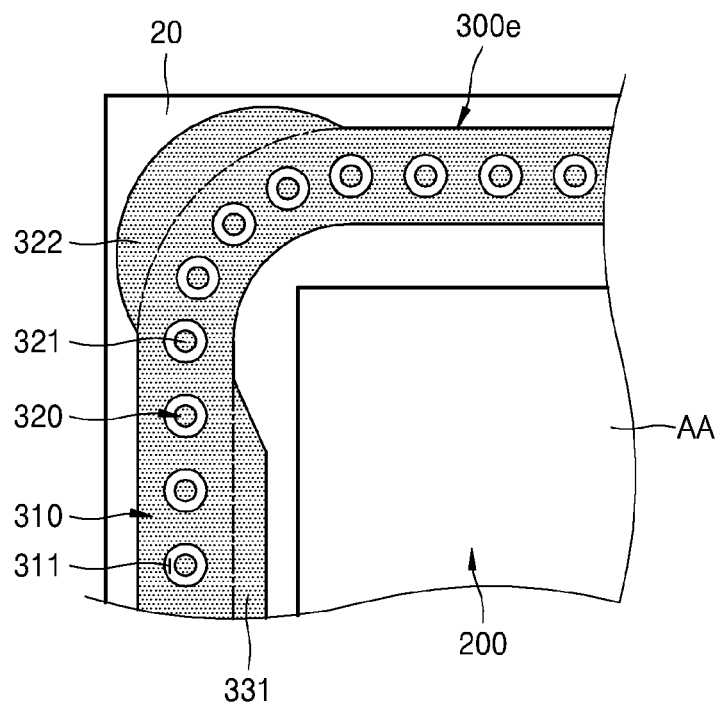
FIG. 7 is a plan view showing another modified example of a sealant.

FIG. 7 is a plan view showing another modified example of a sealant 300e including an expanded sealing portion.

Referring to FIG. 7, the sealant 300e may include the sealing portion 310, the adhesion reinforcing portion 320, and the expanded sealing portion. The expanded sealing portion may be formed at at least one of an inner side and an outer side of the sealing portion 310. For example, a first expanded sealing portion 331 may be formed at an inner side of the sealing portion 310, and a second expanded sealing portion 322 may be formed at an outer side of the sealing portion 310. Bonding strength may be reinforced by the first and second expanded sealing portions 331 and 322.

Hereinafter, a method of manufacturing the OLED display 1, according to an exemplary embodiment, will be briefly described, and then a process of forming the sealant 300 including the sealing portion 310 and the adhesion reinforcing portion 320 will be described.

Figure 8:
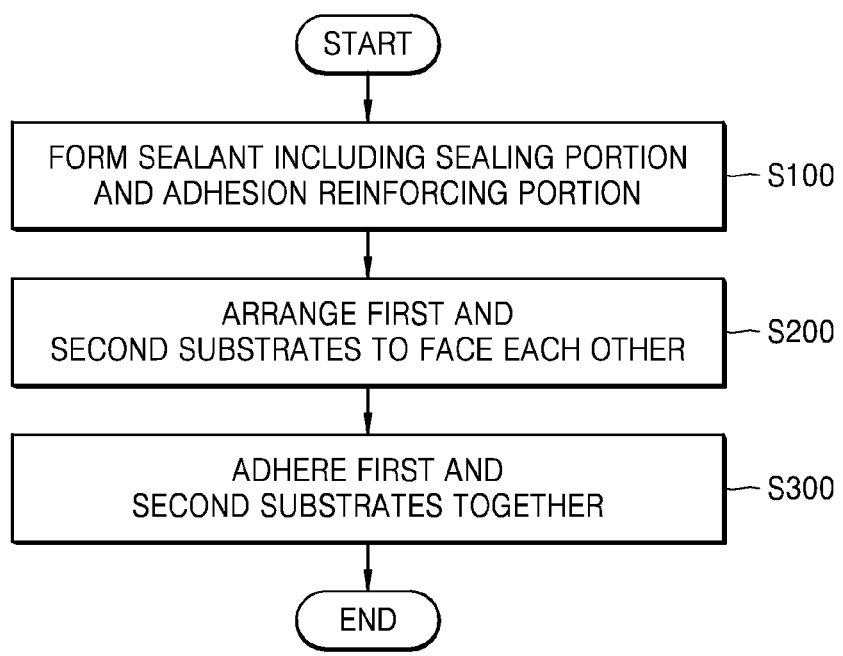
FIG. 8 is a flowchart of a method of manufacturing an OLED display, according to an exemplary embodiment.

FIG. 8 is a flowchart of a method of manufacturing the OLED display 1, according to an exemplary embodiment.

Depending on embodiments, additional states may be added, others removed, or the order of the states changed in the procedure of FIG. 8.

Referring to FIG. 8, the sealant 300 including the sealing portion 310 and the adhesion reinforcing portion 320 is formed on the first or second substrate 10 or 20, in operation S100. The adhesion reinforcing portion 320 includes the islands 321. The sealant 300 may be formed such that the islands 321 are separate from the sealing portion 310. The sealing portion 310 and the adhesion reinforcing portion 320 may include a material that is melted and hardened by a laser beam. For example, the sealing portion 310 and the adhesion reinforcing portion 320 may include glass frit.

The sealing portion 310 and the adhesion reinforcing portion 320 may include the same material. The sealing portion 310 and the adhesion reinforcing portion 320 may be simultaneously formed. The sealant 300 may be formed via a spin coating method.

Then, the first and second substrates 10 and 20 are arranged to face each other in operation S200 such that two end portions of the sealant 300 contact two sides of the first and second substrates 10 and 20. For example, the first and second substrates 10 and 20 are arranged to face each other such that an end portion of the sealant 300 formed on the second substrate 20 contacts the first substrate 10. The display unit 200 is formed inside the sealant 300.

Then, while the first and second substrates 10 and 20 face each other, a laser beam is irradiated onto the sealant 300 in operation S300. The sealant 300 formed between the first and second substrates 10 and 20 is heated, melted by the laser beam, and then hardened. Accordingly, the first and second substrates 10 and 20 are adhered to each other by the sealant 300, and the display unit 200 is sealed.

Figure 9:
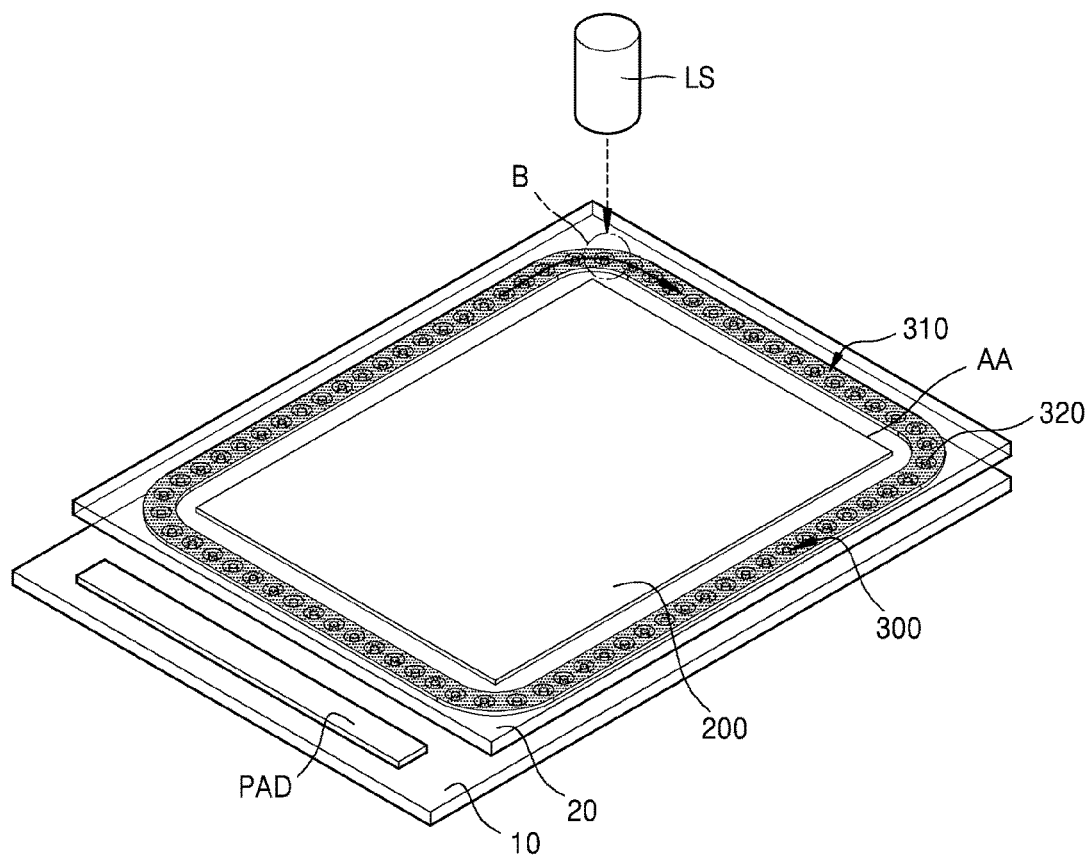
FIG. 9 is a schematic view for describing a process of irradiating a laser beam onto a sealant.
Figure 10:
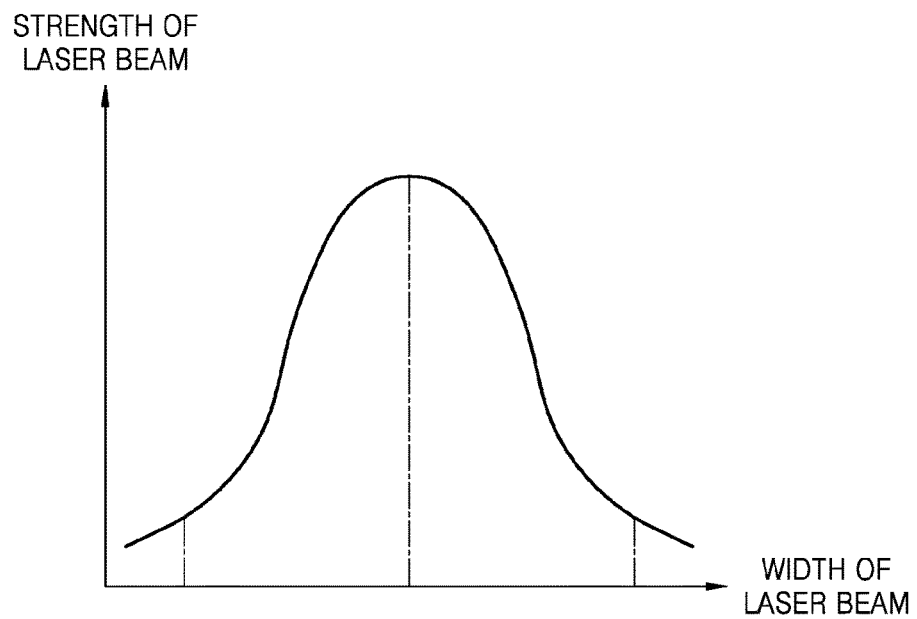
FIG. 10 is a profile of a laser beam irradiated onto a sealant.
Figure 11A:
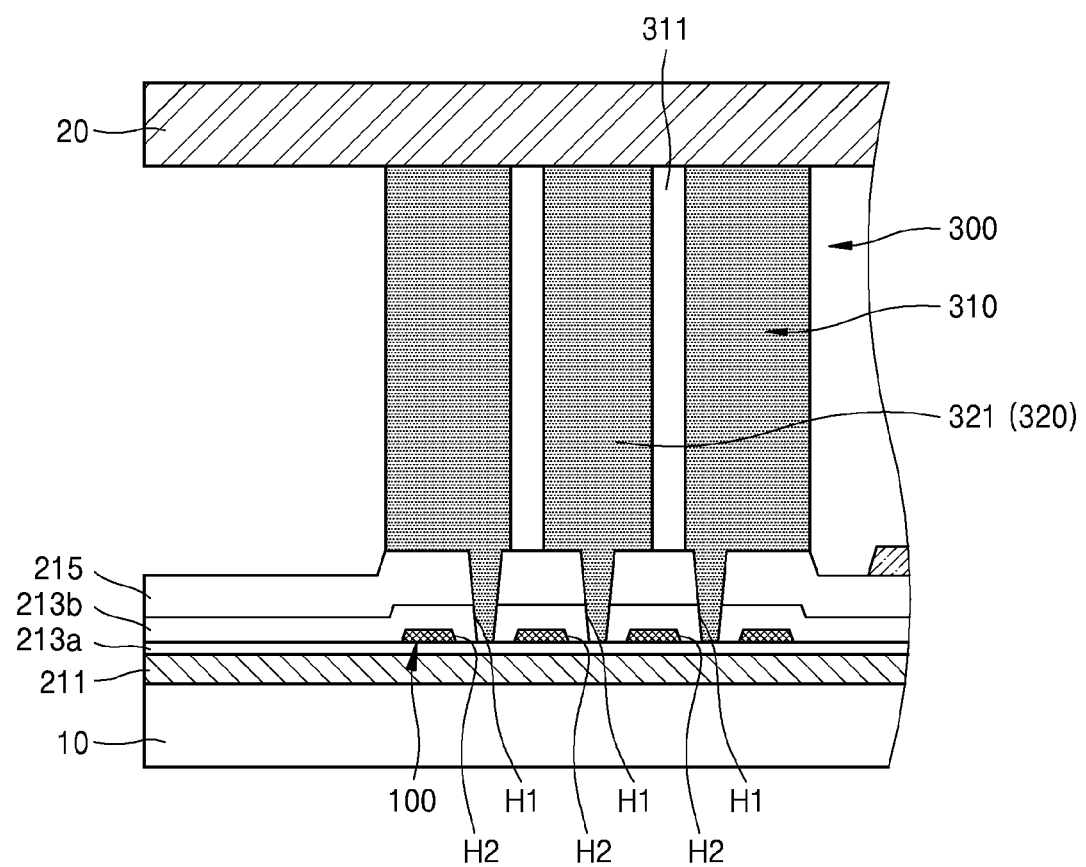
FIGS. 11A and 11B are schematic cross-sectional views showing a change of a sealant as a laser beam is irradiated onto the sealant.
Figure 11B:
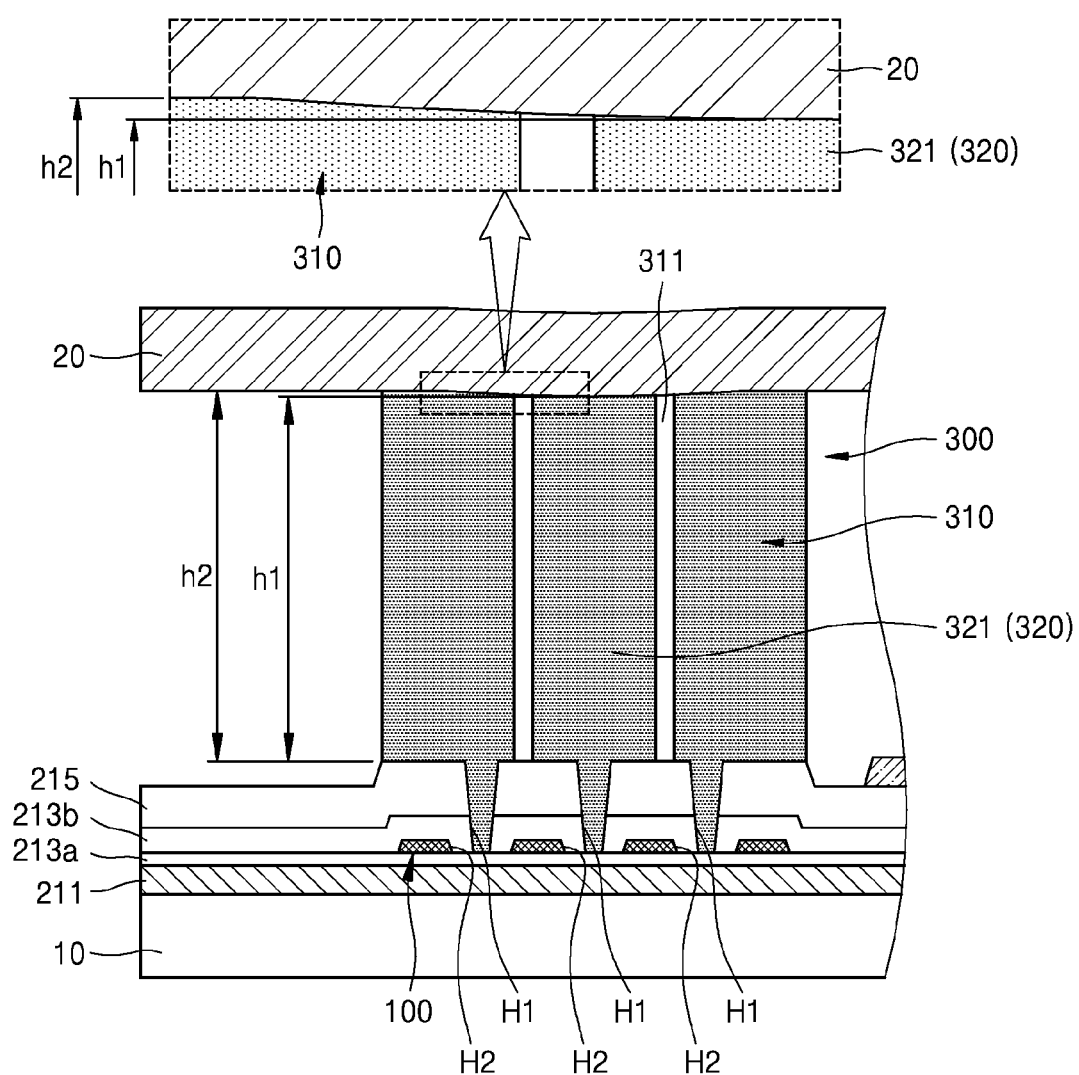

FIG. 9 is a schematic view for describing a process of irradiating a laser beam B onto the sealant 300. FIG. 10 is a profile of the laser beam B irradiated onto the sealant 300, and FIGS. 11A and 11B are schematic cross-sectional views showing a change of the sealant 300 as the laser beam B is irradiated onto the sealant 300. FIG. 11A shows the sealant 300 before the laser beam B is irradiated, and FIG. 11B shows the sealant 300 that is hardened after the laser beam B is irradiated.

Referring to FIG. 9, a laser source LS is separate from and is formed on the second substrate 20. The laser source LS moves along the shape of the sealant 300 while irradiating the laser beam B. A diameter of the laser beam B may be larger than the width of the sealant 300.

As the laser beam B is irradiated onto the sealant 300, the sealant 300 is heated and melted. Then, the sealant 300 is hardened, thereby bonding the first and second substrates 10 and 20 and sealing the display unit 200.

Referring to FIG. 10, the laser beam B irradiated onto the sealant 300 has a profile having a Gaussian shape. In other words, an energy distribution of the laser beam B may be different in a center region and an outer region. For example, energy strength of the laser beam B may be stronger in the center region than the outer region.

The laser beam B may be focused on the adhesion reinforcing portion 320 that is formed at the center in the width direction of the sealant 300. For example, the laser beam B may be focused on the island 321. The center region of the laser beam B may be irradiated onto the adhesion reinforcing portion 320 and the outer region of the laser beam B may be irradiated onto the sealing portion 310. The adhesion reinforcing portion 320 onto which the center region of the laser beam B is irradiated may be heated more than the sealing portion 310 onto which the outer region of the laser beam B is irradiated.

Since the island 321 and the sealing portion 310 are separate from each other, a heat conducting phenomenon generated when the sealing portion 310 and the island 321 contact each other may be prevented. In other words, the adhesion reinforcing portion 320 according to an exemplary embodiment may prevent an energy loss generated when contacting the sealing portion 310. Accordingly, energy concentrated in the adhesion reinforcing portion 320 is larger than energy concentrated in the adhesion reinforcing portion 320 when the adhesion reinforcing portion 320 and the sealing portion 310 contact each other. Accordingly, bond strength of the adhesion reinforcing portion 320 is increased, thereby increasing overall bond strength of the sealant 300.

Referring to FIG. 11A, since the laser beam B is not yet irradiated onto the sealant 300, a height of the sealing portion 310 and a height of the adhesion reinforcing portion 320 may be the same.

On the other hand, referring to FIG. 11B, when the laser beam B is irradiated onto the sealant 300, the sealant 300 is melted. Since the adhesion reinforcing portion 320 and the sealing portion 310 are separate from each other and the laser beam B is irradiated intensively onto the adhesion reinforcing portion 320, the adhesion reinforcing portion 320 may be heated more than the sealing portion 310. Accordingly, the adhesion reinforcing portion 320 is melted more than the sealing portion 310, and thus the height h1 of the adhesion reinforcing portion 320 is lower than the height h2 of the sealing portion 310. For example, the height h1 of the adhesion reinforcing portion 320 may be lower than the height h2 of the sealing portion 310 by about 0.2 μm to about 0.4 μm.

According to at least one of the disclosed embodiments, bonding strength of a sealant may be entirely increased and reliability of a product may be increased without having to increase a sealing width, by increasing bonding strength of a partial region of the sealant.

While the inventive technology has been described with reference to the figures, it will be understood by those of ordinary skill in the art that various changes in form and details may be made therein without departing from the spirit and scope as defined by the following claims.

What is claimed is:

1. An organic light-emitting diode (OLED) display comprising:
   a first substrate and a second substrate facing each other;
   a display unit formed between the first and second substrates; and
   a sealant formed between the first and second substrates and bonding the first and second substrates,
   wherein the sealant comprises:
   a sealing portion surrounding and sealing the display unit, the sealing portion having a plurality of first openings separate from each other along a circumferential direction of the display unit; and
   an adhesion reinforcing portion including a plurality of islands that are respectively disposed inside the first openings and separate from the sealing portion to have a gap between the adhesion reinforcing portion and the sealing portion.

2. The OLED display of claim 1, wherein a size of each of the islands is smaller than a size of a corresponding first opening.

3. The OLED display of claim 1, wherein the adhesion reinforcing portion is formed at a center, in a width direction, of the sealing portion.

4. The OLED display of claim 1, wherein a height of the adhesion reinforcing portion is less than a height of the sealing portion.

5. The OLED display of claim 1, wherein the islands are separate from each other along a length direction of the sealant.

6. The OLED display of claim 1, wherein each of the islands has one of the following shapes: a circle, an oval, and a polygon.

7. The OLED display of claim 1, wherein each of the first openings has one of the following shapes: a circle, an oval, and a polygon.

8. The OLED display of claim 1, wherein a distance between the sealing portion and each of the islands is less than or equal to about 5 µm.

9. The OLED display of claim 1, wherein a width of the sealant is less than or equal to about 1.2 mm.

10. The OLED display of claim 1, wherein the sealing portion has a plurality of second openings that are separate from the first openings in a width direction, and
wherein the adhesion reinforcing portion further comprises a plurality of second islands that are respectively formed inside the second openings and separate from the sealing portion.

11. The OLED display of claim 1, wherein the sealant further comprises an expanded sealing portion formed in at least one of an inner side or an outer side of the sealing portion.

12. The OLED display of claim 1, wherein the islands are substantially evenly spaced apart.

13. The OLED display of claim 1, further comprising:
a first gate insulating film formed over the first substrate;
a metal layer having a plurality of first through holes and formed on the first gate insulating film;
a second gate insulating film covering the metal layer; and
an interlayer insulating film formed on the second gate insulating film, wherein a plurality of second through holes are formed in the second gate insulating film and the interlayer insulating film, and wherein the adhesion reinforcing portion connected to the first gate insulating film via the first and second through holes.

14. The OLED display of claim 13, wherein each of the first through holes is larger than each of the second through holes.

15. The OLED display of claim 1, further comprising at least one insulating layer formed below the sealant, wherein at least one of the sealing portion and the adhesion reinforcing portion penetrates into the insulating layer.

16. The OLED display of claim 15, wherein the at least one insulating layer comprises:
a gate insulating film formed over the first substrate; and
an interlayer insulating film formed over the gate insulating film.

* * * * *